United States Patent
Honda

(10) Patent No.: US 6,330,132 B1
(45) Date of Patent: Dec. 11, 2001

(54) MAGNETIC HEAD WITH HIGH BONDING STRENGTH OF MEMBER FOR BONDING HEAD ELEMENT AND CONDUCTIVE PATTERN CONNECTED TO EXTERNAL CIRCUIT

(75) Inventor: Kenji Honda, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/507,827

(22) Filed: Feb. 22, 2000

(30) Foreign Application Priority Data

Mar. 2, 1999 (JP) .................................................. 11-054770

(51) Int. Cl.$^7$ .................................................... G11B 5/48
(52) U.S. Cl. ............................................................ 360/234.5
(58) Field of Search .............................. 360/234.5, 245.8; 228/180.22

(56) References Cited

U.S. PATENT DOCUMENTS

| | | | |
|---|---|---|---|
| 4,856,181 | 8/1989 | Pichler et al. ........................ | 360/123 |
| 4,949,209 | 8/1990 | Imanaka et al. ..................... | 360/126 |
| 5,001,591 | 3/1991 | Nakashima .......................... | 360/126 |
| 5,326,429 | 7/1994 | Cohen .................................. | 156/655 |
| 5,530,604 | * 6/1996 | Pattanaik ............................ | 360/234.5 |
| 5,610,783 | * 3/1997 | Maffitt et al. ....................... | 360/234.5 |
| 5,820,770 | 10/1998 | Cohen et al. ........................ | 216/22 |
| 5,823,031 | * 10/1998 | Pattanaik ............................ | 219/121.63 |
| 5,862,017 | * 1/1999 | Kohira et al. ....................... | 360/234.5 |
| 5,896,247 | * 4/1999 | Pan et al. ............................ | 360/234.5 |
| 5,956,208 | * 9/1999 | Kawazoe ............................. | 360/234.5 |
| 6,046,882 | * 4/2000 | Pattanaik et al. ................... | 360/234.5 |
| 6,198,599 | * 3/2001 | Senuma .............................. | 360/234.5 |
| 6,256,170 | * 7/2001 | Honda ................................ | 360/234.5 |

FOREIGN PATENT DOCUMENTS

| | | |
|---|---|---|
| 3-20021 | 2/1991 | (JP) . |
| 5-314448 | 11/1993 | (JP) . |
| 07-320434 | * 12/1995 | (JP) . |
| 2001-084543 | * 3/2001 | (JP) . |

* cited by examiner

Primary Examiner—Jefferson Evans
(74) Attorney, Agent, or Firm—Brinks Hofer Gilson & Lione

(57) ABSTRACT

A magnetic head comprises a bump electrically connected to a head element on a side wall of a slider, and a pad covering a protective layer and a contact area of the bump exposed from an flat surface of the protective layer. In the magnetic head, since a bonding member for bonding a conductive pattern to the pad is bonded in a bonding area of the pad formed on the protective layer, secure bonding can be obtained regardless of the form of the contact area of the bump, and a highly reliable magnetic head, without bonding defects, can therefore be provided.

4 Claims, 10 Drawing Sheets

MAGNETIC HEAD WITH HIGH BONDING STRENGTH OF MEMBER FOR BONDING HEAD ELEMENT AND CONDUCTIVE PATTERN CONNECTED TO EXTERNAL CIRCUIT

BACKGROUND OF THE INVENTION

1. Field of the Invention

The present invention relates to a magnetic head having an enhanced bonding strength between a lead wire and a conductive member and having improved reliability, in which the lead wire leads from a head element of a thin film magnetic head and the like, and the conductive member exchanges electrical signals with the head element.

2. Description of the Related Art

As shown in FIG. 9, the front portion of a flexure 2 is cut away in the form of an approximately U-shape to form a small portion 2a, and four conductive patterns 3 composed of copper and coated with gold by plating thereon are formed on the surface of the flexure 2 coated by a polyimide resin.

End portions 3a of the conductive patterns 3 are formed so as to broaden and are lined up on the small portion 2a.

A slider 1 in the form of a rectangular parallelepiped is fixed by bonding at a bottom surface 1b thereof on the small portion 2a of the flexure 2 so that the end portions 3a of the conductive patterns 3 oppose a side wall 1a of the slider 1.

As shown in FIG. 10 and FIG. 11, the side wall 1a of the slider 1 has a head element 7 for writing on and/or reading from a magnetic recording medium, and four lead wires 8, two for writing and two for reading, lead from the head element 7. An edge 8a of each lead wire 8 having a wider area in an approximately rectangular form is formed in the vicinity of the surface of the flexure 2. Individual edges 8a of the four lead wires 8 are disposed so as to oppose the corresponding end portions 3a of the conductive patterns 3 in the vicinity thereof.

As shown in FIG. 11, a bump 10 composed of nickel or the like is provided on the edge 8a of the lead wire 8. The bump 10 is composed of a cylindrical pillar portion 10a having the bottom surface contacting nearly the entire edge 8a of the lead wire 8 and an umbrella-like portion 10b expanding at the front edge of the pillar portion 10a.

The umbrella-like portion 10b of the bump 10 has an excavated top at the top of approximately hemispherical form, and a round area at the center of the umbrella-like portion 10b is to be used as a contact area 10d of the bump 10.

The contact area 10d of the bump 10 has an inclined portion 10f at the periphery thereof and is recessed into the spherical portion 10e of the umbrella-like portion 10b.

A protective layer 9 composed of alumina covers the head element 7, the lead wires 8, and the surfaces of the pillar portions 10a and the spherical portions 10e of the bumps 10 on the side wall 1a, and is formed so as to be flat. The surface of the contact area 10d of the bump 10 is exposed from the protective layer 9, and is recessed from the level of the surface of the protective layer 9 since the inclined portion 10f exists at the boundary of the protective layer 9.

The contact area 10d of the bump 10 exposed from the protective layer 9 is adjacent to the surface of the flexure 2.

In a polishing process for polishing the protective layer 9 so as to expose the contact area 10d of the bump 10, the form of the umbrella-like portion 10b of the bump 10 as described above is formed by polishing the top of the approximately hemispherical umbrella-like portion 10b of the bump 10 together with the protective layer 9.

In the polishing process, the bump 10 composed of a metal, such as nickel, is easily polished since the bump 10 is softer than the protective layer 9 composed of alumina, so that the contact area 10d of the bump 10 exposed from the protective layer 9 has the inclined portion 10f at the boundary of the protective layer 9 and is recessed from the level of the surface of the protective layer 9.

Four rectangular pads 11 composed of thin gold films or the like cover the surfaces of the individual contact areas 10d of the four bumps 10 exposed from the protective layer 9, and are disposed so as to oppose the corresponding end portions 3a of the conductive pattern 3 on the surface of the flexure 2 adjacent to each other.

The pads 11 includes a recessed portion 11a covering the surface of the contact area 10d of the bump 10 and an inclined portion 11f overlaying an inclined portion 10f of the bump 10 from the contact area 10d thereof to the surface of the protective layer 9.

Since the contact area 10d of the bump 10 is adjacent to the surface of the flexure 2, the recessed portion 11a of the pad 11 and the inclined portion 11f thereof are also adjacent to the end portion 3a of the conductive pattern 3 formed on the surface of the flexure 2.

At an angular portion 12 at which the side wall 1a of the slider 1 and the surface of the flexure 2 contact each other, an approximately spherical bonding member 13, composed of gold or the like, is joined in contact with the recessed portion 11a of the pad 11 and the end portion 3a of the conductive pattern 3, so that the pad 11 and the conductive pattern 3 are connected to each other. On the surface of the approximately spherical bonding member 13, a protruding residual portion 13a remains.

As shown in FIGS. 12 and 13, there is a conventional example in which wire 15 is used as the bonding member, and in which an edge portion 15a of the wire 15 is bonded to the recessed portion 11a of the pad 11, and the other edge portion 15b of the wire 15 is bonded to the end portion 3a of the conductive pattern 3.

In the magnetic head described above, the surface of the slider 1 is disposed so as to oppose the magnetic recording surface of the magnetic disc, and the slider 1 fixed to the flexure 2 is raised at a predetermined distance over the magnetic recording surface of the magnetic disc during an operation of the magnetic hard disc. The head element 7 is connected to an external circuit through the lead wires 8, the bumps 10, and the conductive patterns bonded by the bonding members to the bumps 10 via the pads 11 so as to perform magnetic writing on and reading from the magnetic disc by transmission of electric signals of electric circuits from the head element 7 to the external circuit.

In a bonding process for bonding the pad 11 and the conductive pattern 3 by using the spherical bonding member 13, as shown in FIG. 14, a front edge of a fine gold wire 17 drawn from a capillary 16 for bonding is melted by discharging, whereby the spherical bonding member 13 is formed. When the bonding member 13 contacts the recessed portion 11a of the pad 11 and the surface of the end portion 3a of the conductive pattern 3, ultrasonic vibration is imparted to the bonding member 13, and the bonding member 13 is bonded to the pad 11 and to the end portion 3a of the conductive pattern 3 by ultrasonic welding.

In this case, since the pad 11 has the recessed portion 11a adjacent to the end portion 3a of the conductive pattern 3 in the conventional magnetic head, depending on the size of the spherical bonding member 13, the bonding member 13 may be bonded to the end portion 3a of the conductive pattern 3 and an angular portion of the inclined portion 11f of the pad 11, as shown in FIG. 15. Consequently, there is a problem in that contact defects between the bonding member 13 and the pad 11 may occur.

When the spherical bonding member 13 rotates along the inclined portion 11f of the pad 11, as shown in FIG. 16, the bonding member 13 is placed at the pad 11 side and is raised from the end portion 3a of the conductive pattern 3, so that there is a problem in that contact failure with the conductive pattern 3 may occur.

When the bonding member for bonding the pad 11 and the conductive pattern 3 is the wire 15, as shown in FIGS. 12 and 13, the front edge portion 15a of the wire 15 is contacted to the recessed portion 11a of the pad 11, and then the front edge portion 15a of the wire 15 and the recessed portion 11a of the pad 11 are bonded by ultrasonic vibration imparted to the wire 15. Subsequently, after forming a bending portion 15c in the wire 15, the other edge portion 15b of the wire 15 is contacted to the end portion 3a of the conductive pattern 3, and then ultrasonic vibration is imparted to the wire 15, whereby the other edge portion 15b of the wire 15 and the end portion 3a of the conductive pattern 3 are bonded to each other.

In this case, since the pad 11 has the inclined portion 11f in a conventional magnetic head, as shown in FIG. 17, the front edge portion 15a of the wire 15 contacts the angular portion of the inclined portion 11f of the pad 11 and is raised from the pad 11. Consequently, the bonding area between the wire 15 and the pad 11 is small, and contact defects occur therebetween.

SUMMARY OF THE INVENTION

As a first means for solving the problem described above, a magnetic head according to the present invention comprises a slider having a head element for performing writing on and/or reading from a magnetic recording medium, and a bump composed of metal and having an electrical contact area, the bump being electrically connected to the head element, the head element and the bump being formed at a side wall of the slider; a protective layer composed of an insulating material; a pad composed of a metal film; a bonding member; and a conductive pattern for electrically connected to an external circuit. The magnetic head has a construction, in which the protective layer covers over the side wall of the slider except for the contact area of the bump, the pad covers the surfaces of the protective layer and the contact area of the pad, and is bonded to the conductive pattern with the bonding member therebetween, and the bonding member is bonded in a bonding area of the pad formed on the surface of the protective layer.

In the magnetic head according to the present invention, the contact area of the bump formed on the side wall of the slider and electrically connected to the head element is exposed at the flat surface of the protective layer covering the side wall of the slider, and the pad composed of metal and covering the surfaces of the contact area of the bump and the protective layer is bonded with the bonding member to the conductive pattern for electrically connected to an external circuit. In this construction, since the bonding member is bonded in the flat bonding area of the pad formed on the protective layer, the bonding member and the pad, and the bonding member and the conductive pattern, are securely bonded to each other regardless of the form of the contact area of the bump, a highly reliable magnetic head without any bonding defects can be provided.

As a second means for solving the problems described above, a magnetic head according to the present invention has a construction, in which the slider and the conductive pattern are disposed so that end portions of the conductive pattern oppose the side wall of the slider on a flexure, and the bonding member is approximately spherical, and contacts the bonding area approximately at the center thereof of the pad and the end portion of the conductive pattern.

In the case in which the end portion of the conductive pattern is formed to oppose the side wall of the slider and the bonding member is composed of metal and is approximately spherical, the bonding member is designed to be bonded to the bonding area at approximately the center thereof. Consequently, since the bonding area and the area adjacent thereto at which the approximately spherical bonding member is bonded is flat, and the bonding member can securely be bonded to the pad without any slippage of the bonding member during a bonding process, a highly reliable magnetic head without any bonding defects can be provided.

As a third means for solving the problems described above, a magnetic head according to the present invention has a construction, in which the slider and the conductive pattern are disposed so that end portions of the conductive pattern oppose the side wall of the slider on a flexure, and the bonding member is a wire, and contacts the bonding area at the front edge portion of the wire and the conductive pattern at the other edge portion of the wire.

In the case in which the end portion of the conductive pattern is formed to oppose the side wall of the slider and the bonding member is a wire, the bonding area of the pad at which the front edge portion of the wire 15 is bonded is flat and the front edge portion thereof is not raised. Consequently, the bonding member in the form of a wire can securely be bonded to the pad, and a highly reliable magnetic head without any bonding defects can be provided.

As a fourth means for solving the problems described above, a magnetic head according to the present invention has a construction, in which the bonding area is a part of the pad, being at least a half of the height of the pad from the conductive pattern and being adjacent thereto.

More preferably, since the bonding area of the pad is at least a half of the vertical height thereof from the conductive pattern as shown in the drawings, the bonding area is wide, sufficient contacting area for the bonding member for electrical contact can be obtained, the size of the bonding member can be increased, and the stable bonding can be achieved within the bonding area even when the position of the bonding member is slightly moved.

Consequently, a highly reliable magnetic head without any bonding defects can be provided.

DESCRIPTION OF THE PREFERRED EMBODIMENTS

Figure 1:
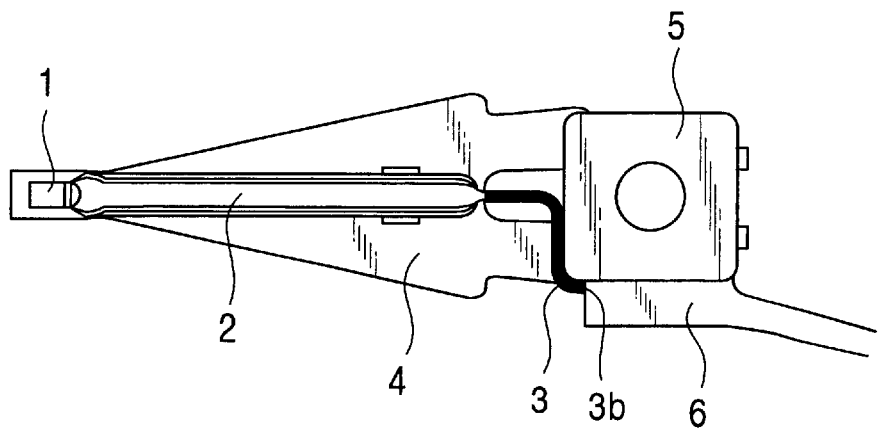
FIG. 1 is an overall view of a magnetic head according to the present invention.

As shown in FIG. 1, a typical structure used for a magnetic hard disc apparatus includes a resilient load beam 4 composed of stainless steel, a mount 5 composed of stainless steel and fixed at the back end of the load beam 4, a flexible cable 6 mounted to the mount 5 and extended to the rear of the load beam 4, and a flexure 2 composed of a thin flexible stainless steel plate and extended from the front to the back of the load beam 4.

Figure 2:
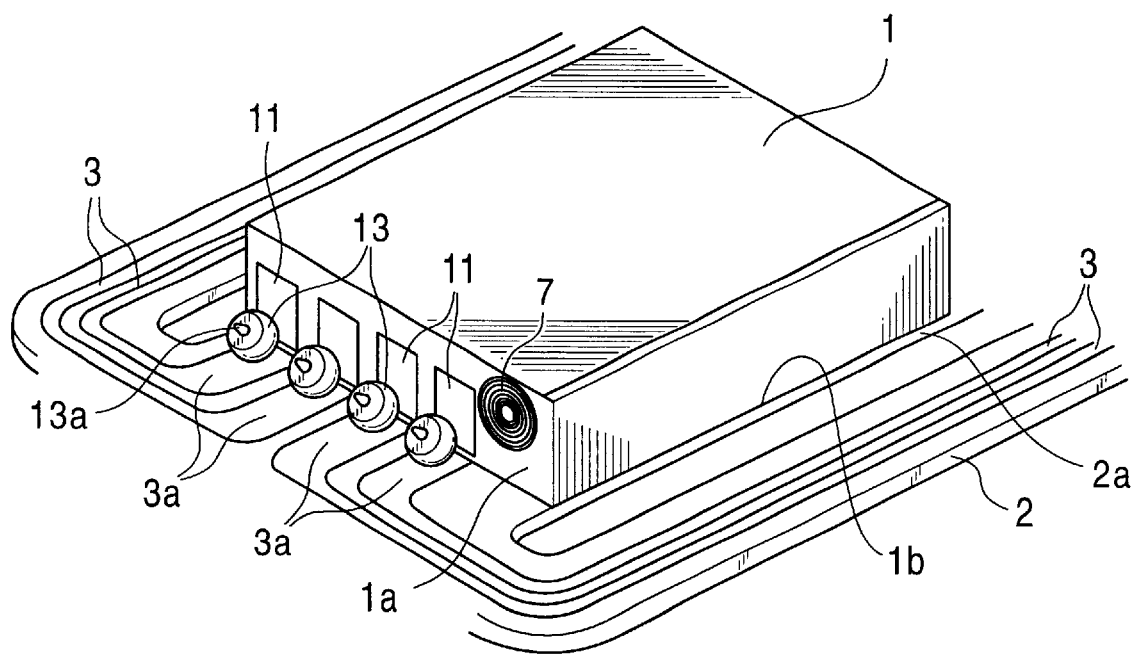
FIG. 2 is an enlarged perspective view of a front portion of the magnetic head according to the present invention.

As shown in FIG. 2, the front portion of the flexure 2 is cut away in the form of an approximately U-shape to form a small portion 2a, and four conductive patterns 3 composed of copper and coated with gold by plating thereon are formed on the surface of the flexure 2 coated by a polyimide resin.

End portions 3a of the conductive patterns 3 are formed so as to broaden and are lined up on the small portion 2a, and the other end portions 3b are connected to a wiring pattern (not shown) of the flexible cable 6 at the back portion of the flexure 2.

A slider 1 in the form of a rectangular parallelepiped is fixed by bonding at a bottom surface 1b thereof on the small portion 2a of the flexure 2 so that the end portions 3a of the conductive pattern 3 oppose a side wall 1a of the slider 1.

In FIG. 2, the end portions 3a of the conductive pattern 3 formed on the flexure 2 and the side wall 1a of the slider 1 are not necessarily to be opposed orthogonally to each other, and they may be formed to oppose each other at any freely selected angle.

Figure 3:
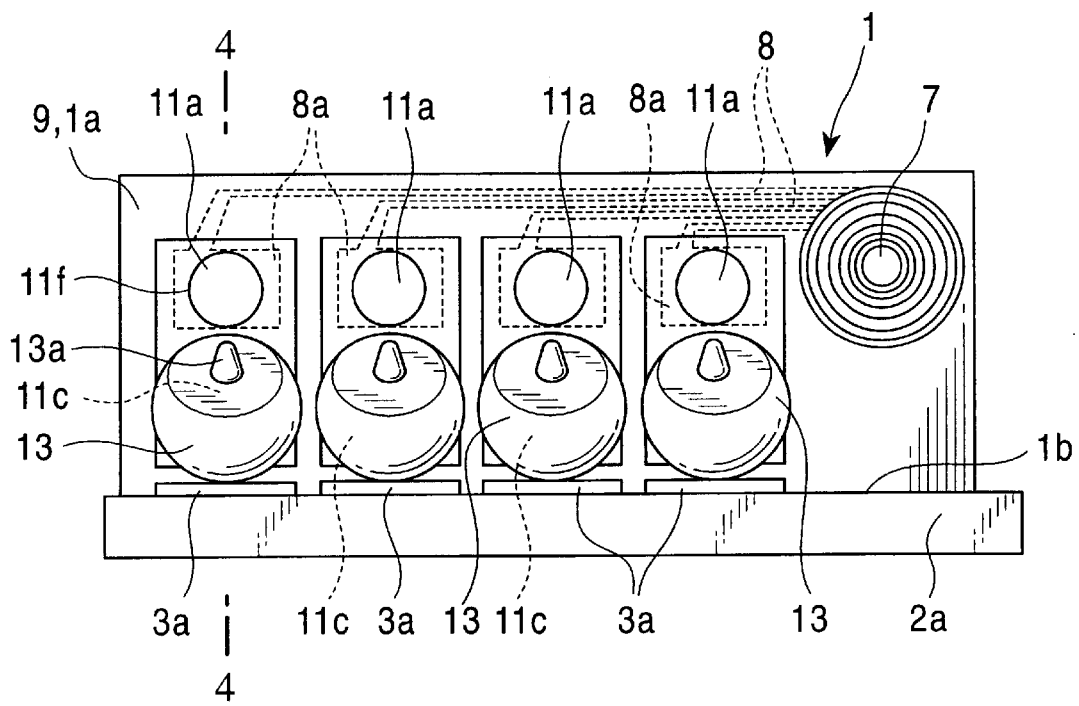
FIG. 3 is a plan view of a side wall of a slider of the magnetic head according to the present invention.

As shown in FIG. 2 and FIG. 3, the side wall 1a of the slider 1 bonded at the bottom surface 1b thereof to the flexure 2 has a head element 7 for writing on and/or reading from a magnetic recording medium, and four lead wires 8, two for writing and two for reading, lead from the head element 7. Edges 8a of individual lead wires 8, in approximately rectangular form, are disposed in an area which is sufficiently distant from the surface of the flexure 2 so as to be lined up adjacent to corresponding end portions 3a of the conductive patterns 3.

Figure 4:
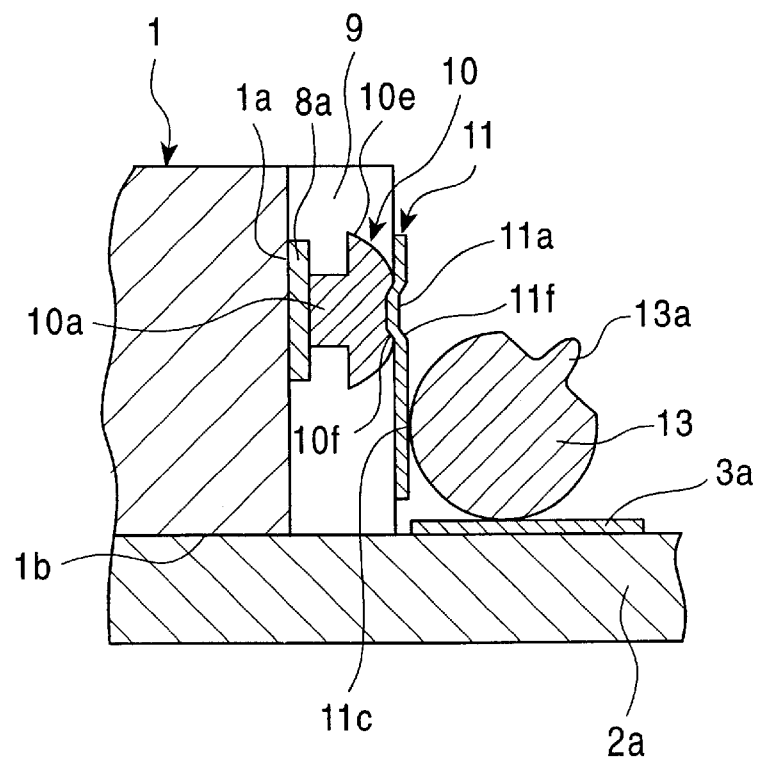
FIG. 4 is a cross-sectional view of a side wall of the slider of the magnetic head taken along the line 4—4 in FIG. 3.

As shown in FIG. 4, a bump 10 composed of nickel or the like is provided on the edge 8a of each lead wire 8. The bump 10, which has a form similar to that of a conventional one but is smaller, is composed of a cylindrical pillar portion 10a having the bottom surface contacting nearly the entire edge 8a of the lead wire 8 and an umbrella-like portion 10b expanding at the front edge of the pillar portion 10a.

The umbrella-like portion 10b of the bump 10 has an excavated top at the top of the approximately hemispherical form, and a round area at the center of the umbrella-like portion 10b is to be used as a contact area 10d of the bump 10.

The contact area 10d of the bump 10 has an inclined portion 10f at the periphery thereof and is recessed into the spherical portion 10e of the umbrella-like portion 10b.

A protective layer 9 composed of alumina covers the head element 7, the lead wire 8, and the surfaces of the pillar portion 10a and the spherical portion 10e of the bump 10 on the side wall 1a, and is formed so as to be flat. The surface of the contact area 10d of the bump 10 is exposed from the protective layer 9 and is recessed to the level below the surface of the protective layer 9 since the inclined portion 10f exists at the boundary of the protective layer 9.

The contact area 10d of the bump 10 exposed from the protective layer 9 is disposed so as to be sufficiently distant from the surface of the flexure 2.

In the polishing process for polishing the protective layer 9 covering the entire bump 10 so as to expose the contact area 10d of the bump 10, the form of the umbrella-like portion 10b of the bump 10 described above is formed by polishing the top of the approximately hemispherical umbrella-like portion 10b of the bump 10 together with the protective layer 9.

In the polishing process, the bump 10 composed of a metal such as nickel, is easily polished since the bump 10 is softer than the protective layer 9 composed of alumina, so that the contact area 10d of the bump 10 exposed from the protective layer 9 has the inclined portion 10f at the boundary of the protective layer 9 and is recessed from the level of the surface of the protective layer 9. A method for manufacturing the bump will be described later in detail.

Four pads 11 in the form of thin rectangular films composed of gold or the like cover the corresponding contact areas 10d of the four bumps 10 exposed from the protective layer 9 at areas which are sufficiently distant from the surface of the flexure 2. The pad 11 is formed from the contact areas 10d of the bump 10 to the surface of the protective layer adjacent to the flexure 2 through the peripheral inclined portion 10f of the contact area 10d of the bump 10 and the surface of the protective layer 9.

Among areas of the pad 11 covering the surface of the protective layer 9, the area closer to the surface of the flexure 2 than that to the contact area 10d of the bump 10 is designated as a bonding area 11c. The pad 11 has a sufficiently large bonding area 11c at the end portion 3a side of the conductive pattern 3 formed on the surface of the flexure 2.

At an angular portion 12 at which the side wall 1a of the slider 1 and the surface of the flexure 2 contact each other, an approximately spherical bonding member 13, composed of gold or the like, is joined in contact with the bonding area 11c of the pad 11 and the end portion 3a of the conductive pattern 3, so that the pad 11 and the conductive pattern 3 are connected to each other. On the surface of the approximately spherical bonding member 13, a protruding residual portion 13a remains.

Figure 5:
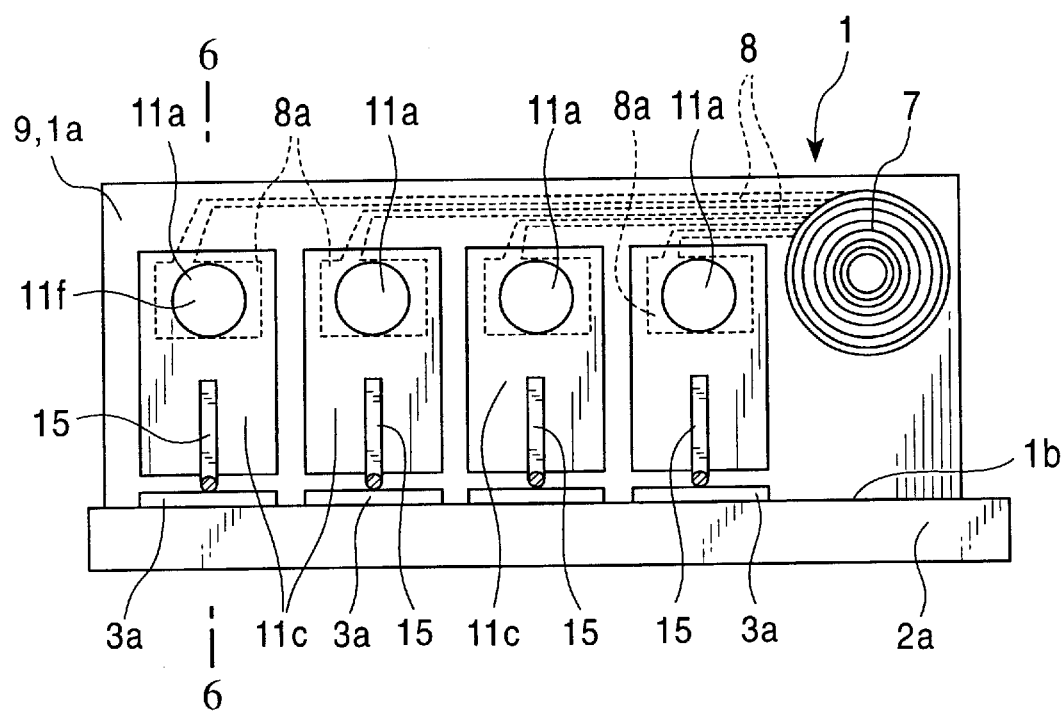
FIG. 5 is a plan view of a side wall of the magnetic head of another embodiment according to the present invention.
Figure 6:
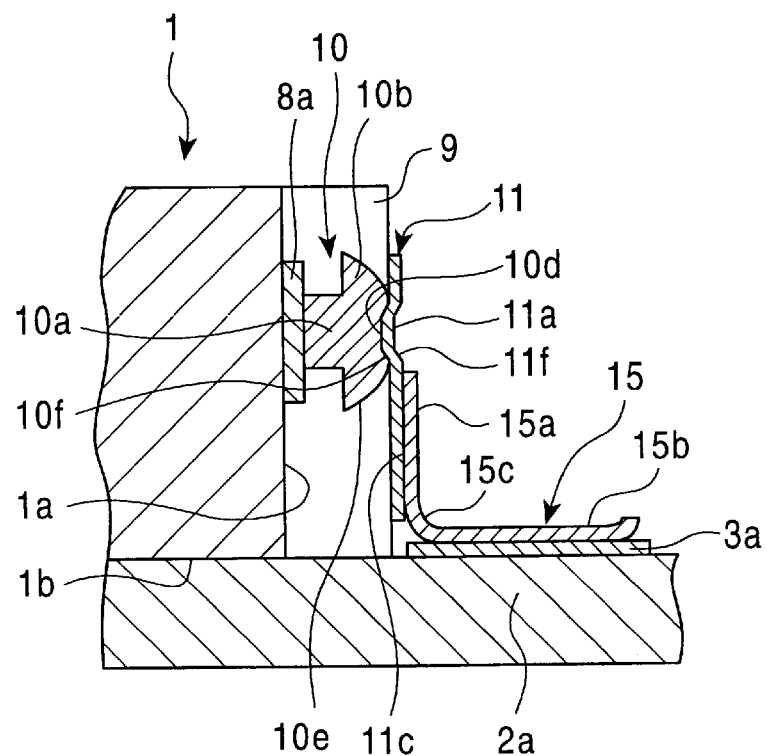
FIG. 6 is a cross-sectional view of the side wall of the magnetic head taken along the line 6—6 in FIG. 5.

FIGS. 5 and 6 show another embodiment of the present invention, in which a wire 15 is used as the bonding member. A front edge portion 15a of the wire 15 composed of gold or the like is bonded to the bonding area 11c of the pad 11, and the other edge portion 15b of the wire 15 is bonded to the end portion 3a of the conductive pattern 3.

Next, in the method for manufacturing the magnetic head described above, a bonding process for bonding the pad 11 and the conductive pattern 3 by using the approximately spherical bonding member 13, will be described.

Figure 7:
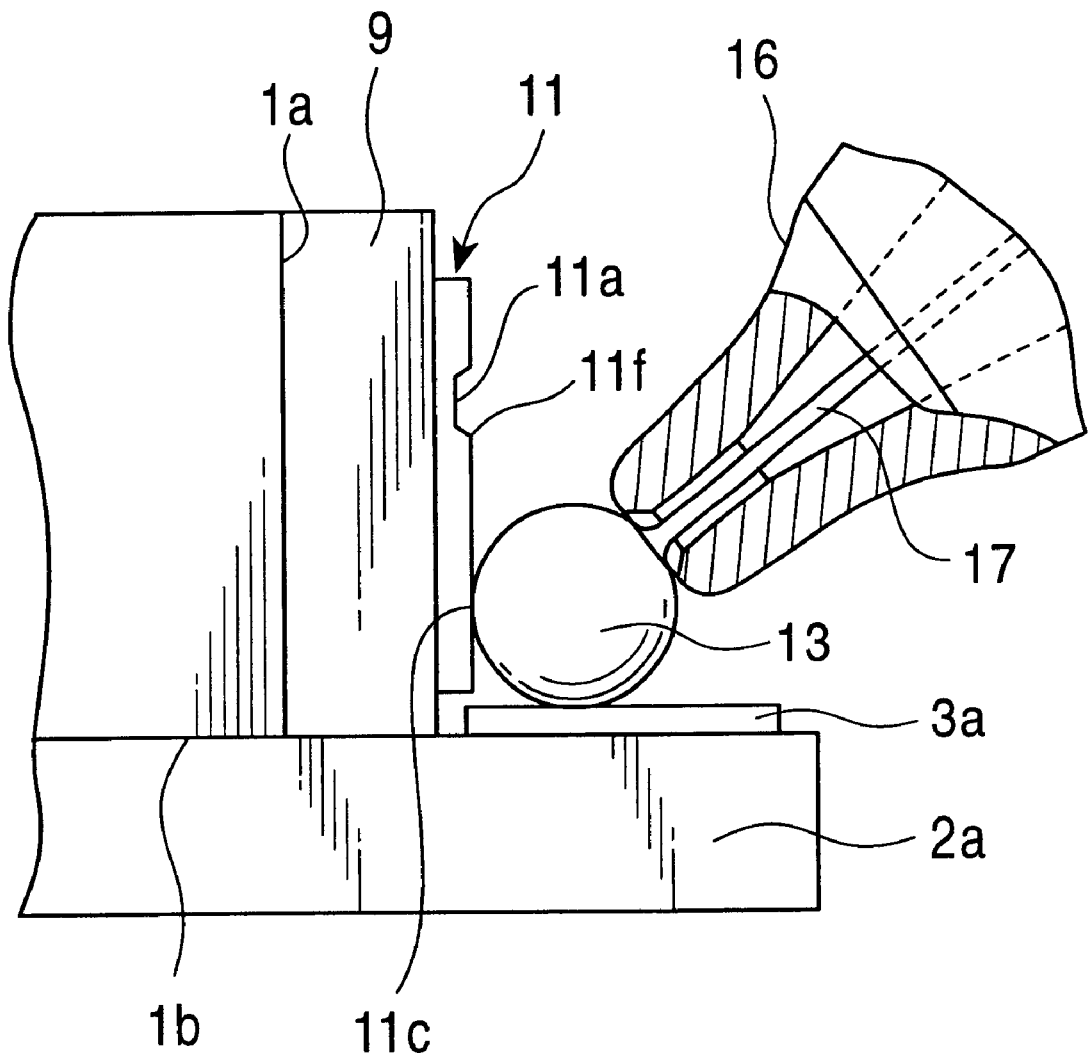
FIG. 7 is an explanatory drawing showing a bonding process for the magnetic head according to the present invention.

As shown in FIG. 7, a fine gold wire 17 is drawn from a capillary 16 for bonding and is melted at a front edge of the fine gold wire 17 by discharging, whereby the approximately spherical bonding member 13 is formed.

When the flexure 2 having the slider 1 and the conductive pattern 3 is in the state of being fixed by a fixture (not shown), the bonding member 13 contacts the bonding area 11c of the pad 11 and the surface of the end portion 3a of the conductive pattern 3. Then, ultrasonic vibration is imparted to the bonding member 13 through capillary 16, and the bonding member 13 is bonded to the bonding area 11c of the pad 11 and to the end portion 3a of the conductive pattern 3 by ultrasonic welding.

At the end of the process, the fine wire 17 is torn off by pulling. In this stage, a part of the fine wire 17 torn off remains as the residual portion 13a.

When the bonding member for bonding the pad 11 and the conductive pattern 13 is the wire 15, as shown in FIGS. 5 and 6, the front edge portion 15a of the wire 15 is contacted to the bonding area 11c of the pad 11, and then the front edge portion 15a of the wire 15 and the bonding area 11c of the pad 11 are bonded by ultrasonic vibration imparted to the wire 15. Subsequently, after forming a bending portion 15c in the wire 15, the other edge portion 15b of the wire 15 is contacted to the end portion 3a of the conductive pattern 3, and then ultrasonic vibration is imparted to the wire 15, whereby the other edge portion 15b of the wire 15 and the end portion 3a of the conductive pattern 3 are bonded to each other.

Next, in the method for manufacturing the magnetic head described above, a method for forming the bump 10 and the pad 11 will be specifically described with reference to FIG. 8.

The head element 7 and the lead wires 8 extending from the head element 7 are formed on the side wall 1a of the slider 1. In this stage, the lead wires 8 are formed approximately rectangularly and the edges 8a thereof are disposed at positions being sufficiently far from the bottom 1b of the slider 1 to be bonded to the flexure 2 in a subsequent process.

Figure 8A:
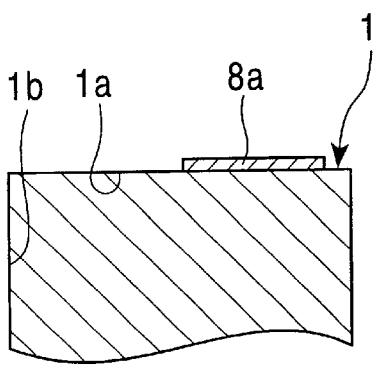
FIGS. 8A to 8F are explanatory drawings showing a manufacturing method of a bump and a pad of the magnetic head according to the present invention.

FIG. 8A shows a cross-sectional view of the edge 8a of the lead wire 8 formed on the side wall of the slider 1.

Figure 8B:
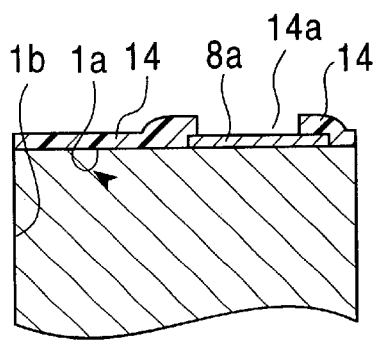

In a process for forming a resist film, shown in FIG. 8B, a resist film 14 is formed on the surface of the side wall 1a, and then by using photolithographic etching, a round window 14a, which nearly conforms to the edge 8a of the lead wire 8, is formed in the resist film 14.

Figure 8C:
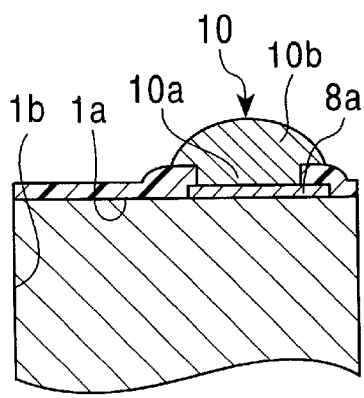

In a process for forming the bump, shown in FIG. 8C, the edge 8a of the lead wire 8 is plated with nickel, aluminum, copper or the like at the window 14a of the resist film 14. In this stage, the plating layer for the bump 10 is formed so as to protrude in the window 14a of the resist film 14 and so as to spread at the periphery of the window 14a, whereby the approximately hemispherical umbrella-like portion 10b is formed.

Concerning the bump 10, similarly to the lead wire 8, the bump 10 is formed so as to be distant from the bottom surface of the slider 1. After forming the bump 10, the resist film is removed.

Figure 8D:
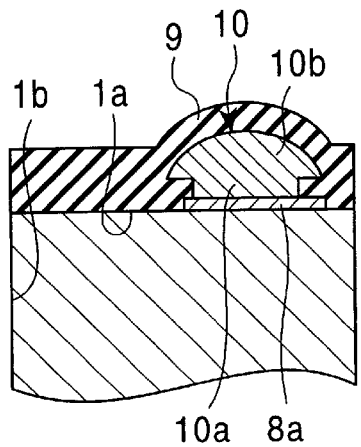

Next, in a process for forming the protective layer, shown in FIG. 8D, by using a vacuum deposition method such as sputtering, the protective layer 9 composed of alumina is formed on the side wall 1a of the slider 1 so as to cover the entire bump 10.

Figure 8E:
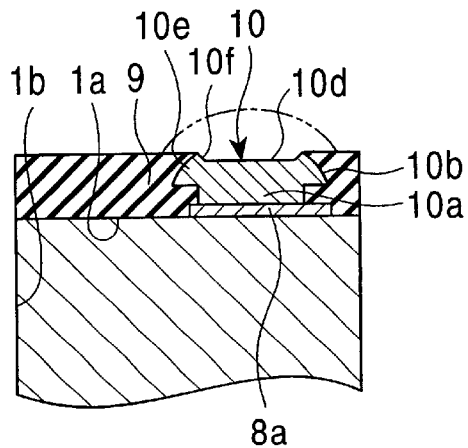

In a polishing process shown in FIG. 8E, the bump 10 is exposed from the protective layer 9 by polishing the surface of the protective layer 9, and simultaneously, the top in the form of a hemisphere of the umbrella-like portion 10b of the bump is polished, whereby the round contact area 10d is formed at the center of the umbrella-like portion 10b of the bump 10. In this polishing process, the bump 10 composed of a metal such as nickel, is easily polished since the bump 10 is softer than the protective layer 9 composed of alumina, and the contact area 10d of the bump 10 exposed from the protective layer 9 is recessed from the level of the surface of the protective layer 9 and has the inclined portion 10f at the boundary of the protective layer 9.

Figure 8F:
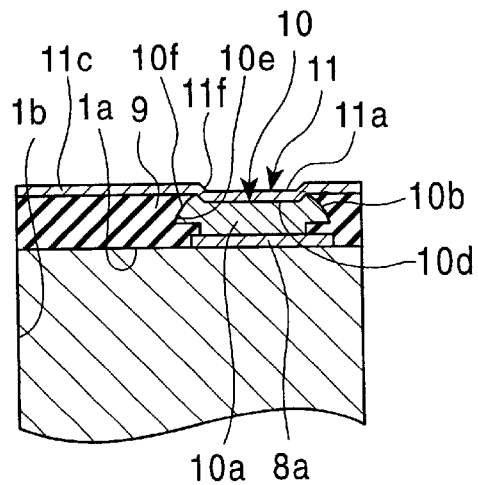
Figure 9:
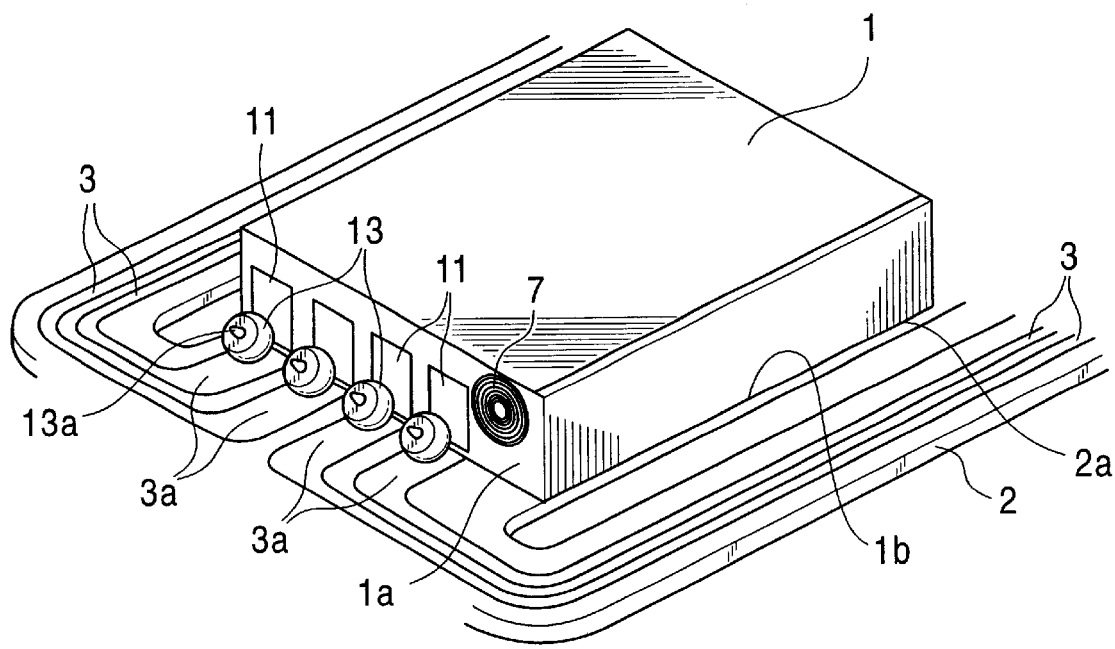
FIG. 9 is an enlarged perspective view of a front portion of a conventional magnetic head.
Figure 10:
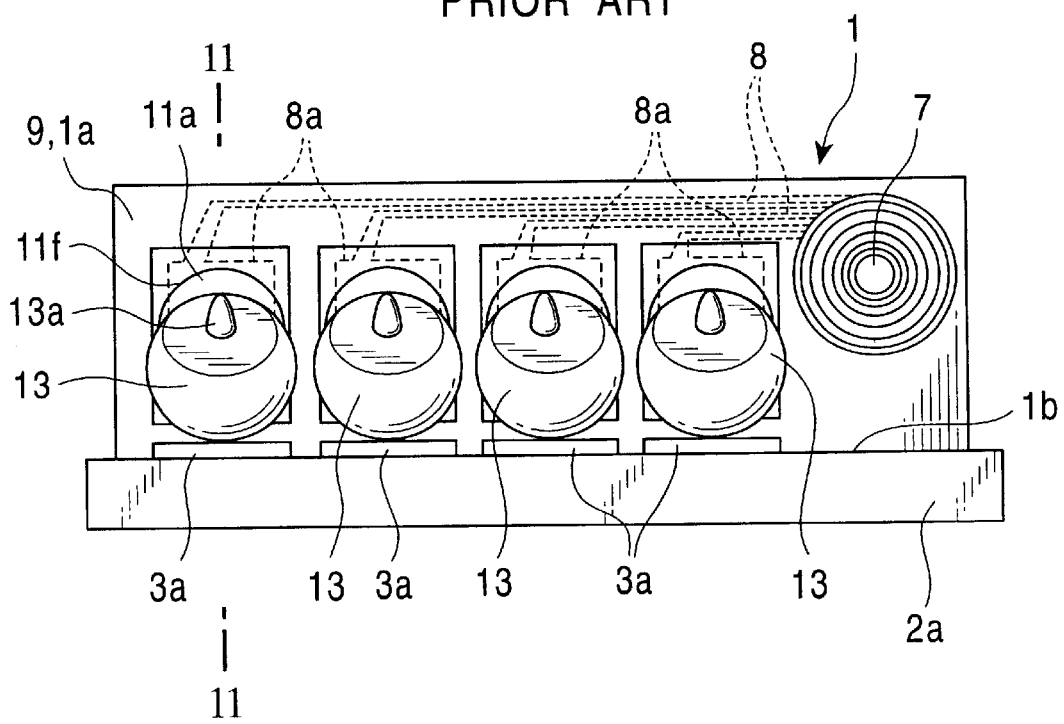
FIG. 10 is a plan view of a side wall of a slider of the conventional magnetic head.
Figure 11:
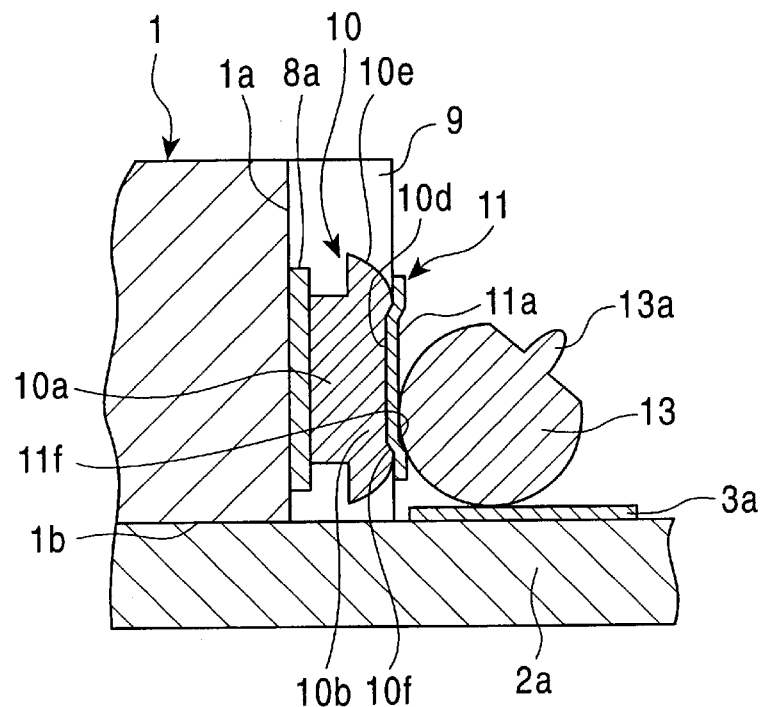
FIG. 11 is a cross-sectional view of the side wall of the slider of the conventional magnetic head taken along the line 11—11 in FIG. 10.
Figure 12:
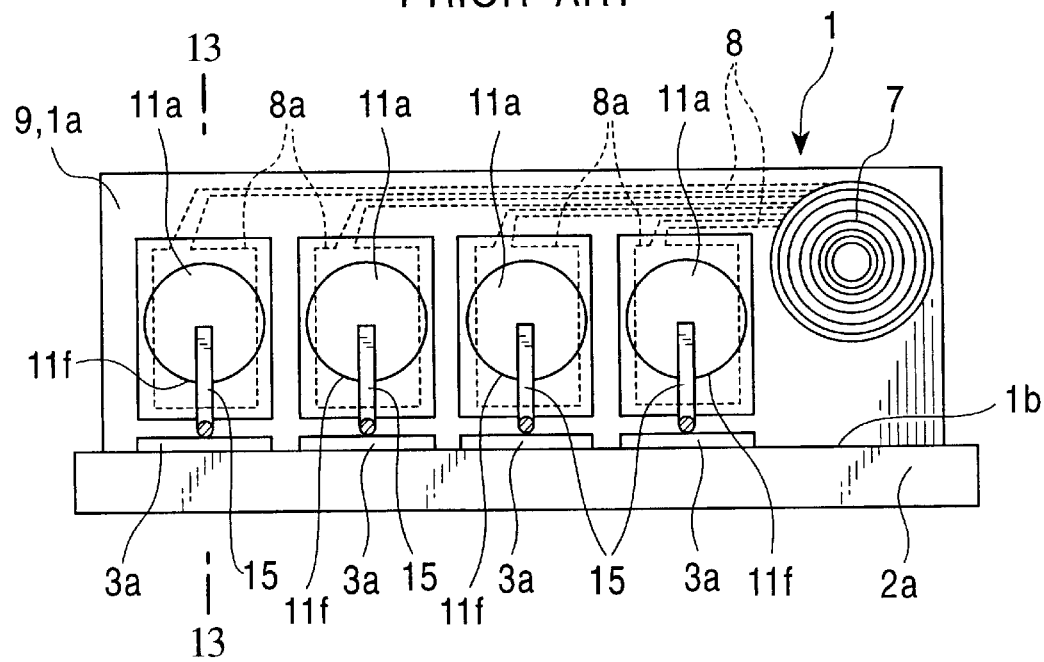
FIG. 12 is a plan view of a side wall of a slider of a conventional magnetic head of another embodiment.
Figure 13:
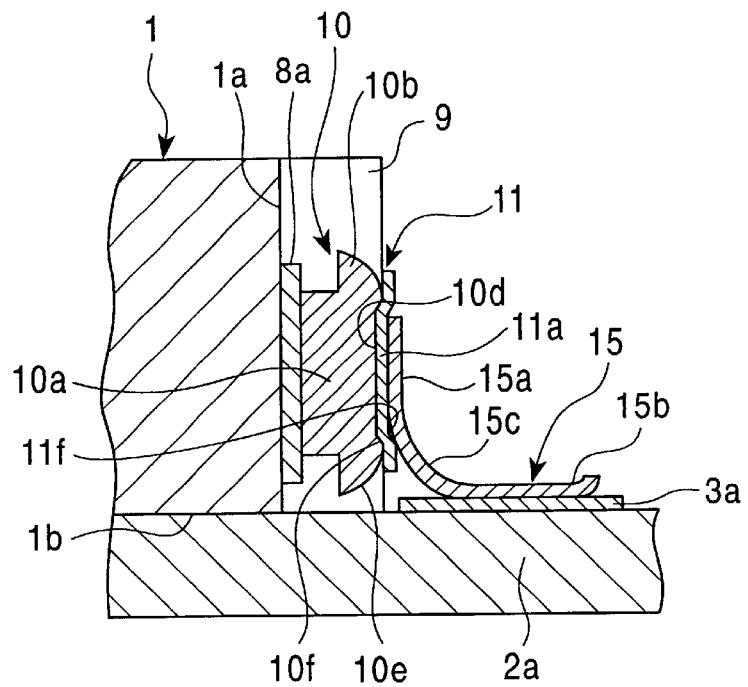
FIG. 13 is a cross-sectional view of the side wall of the slider of the conventional magnetic head taken along the line 13—13 in FIG. 12.
Figure 14:
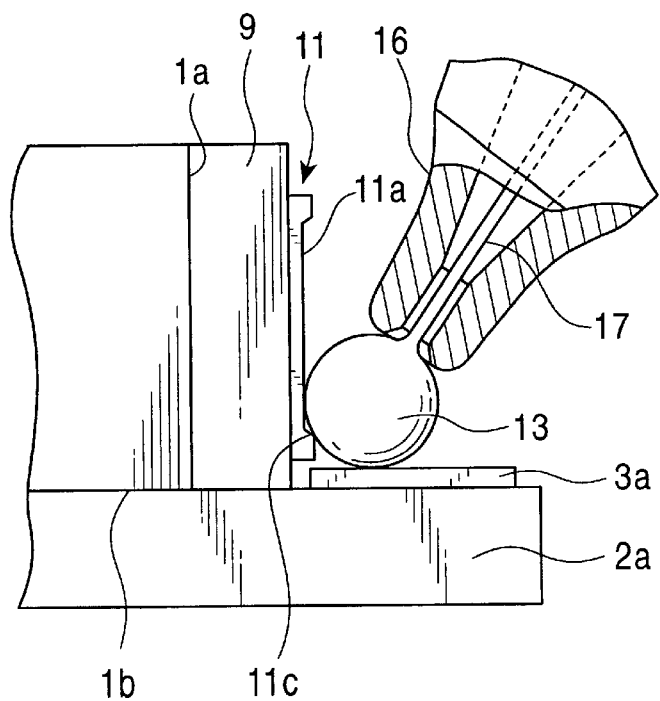
FIG. 14 is an explanatory drawing showing a bonding process for the conventional magnetic head.
Figure 15:
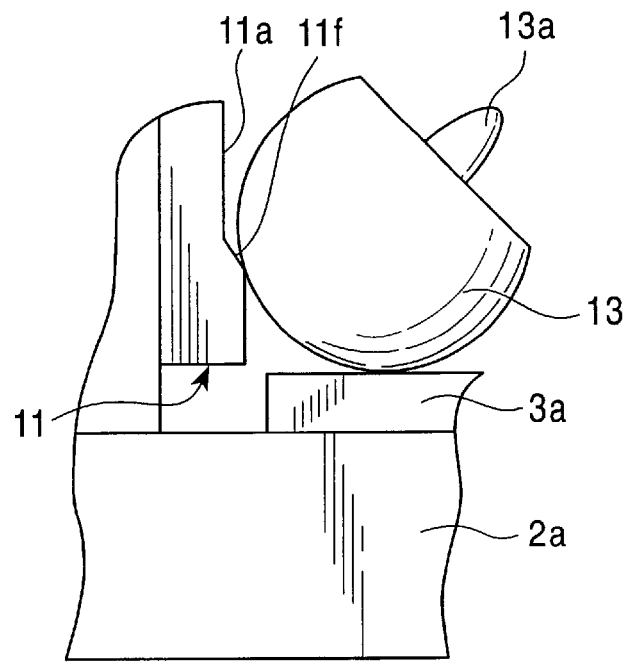
FIG. 15 is an example explanatory drawing showing a bonded state of a pad and a bonding member of the conventional magnetic head.
Figure 16:
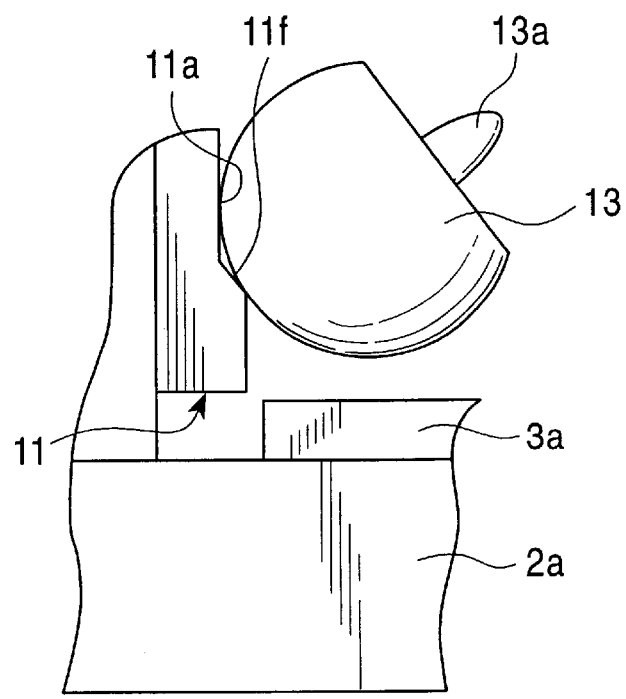
FIG. 16 is an example explanatory drawing showing a bonded state of a pad and a bonding member of the conventional magnetic head.
Figure 17:
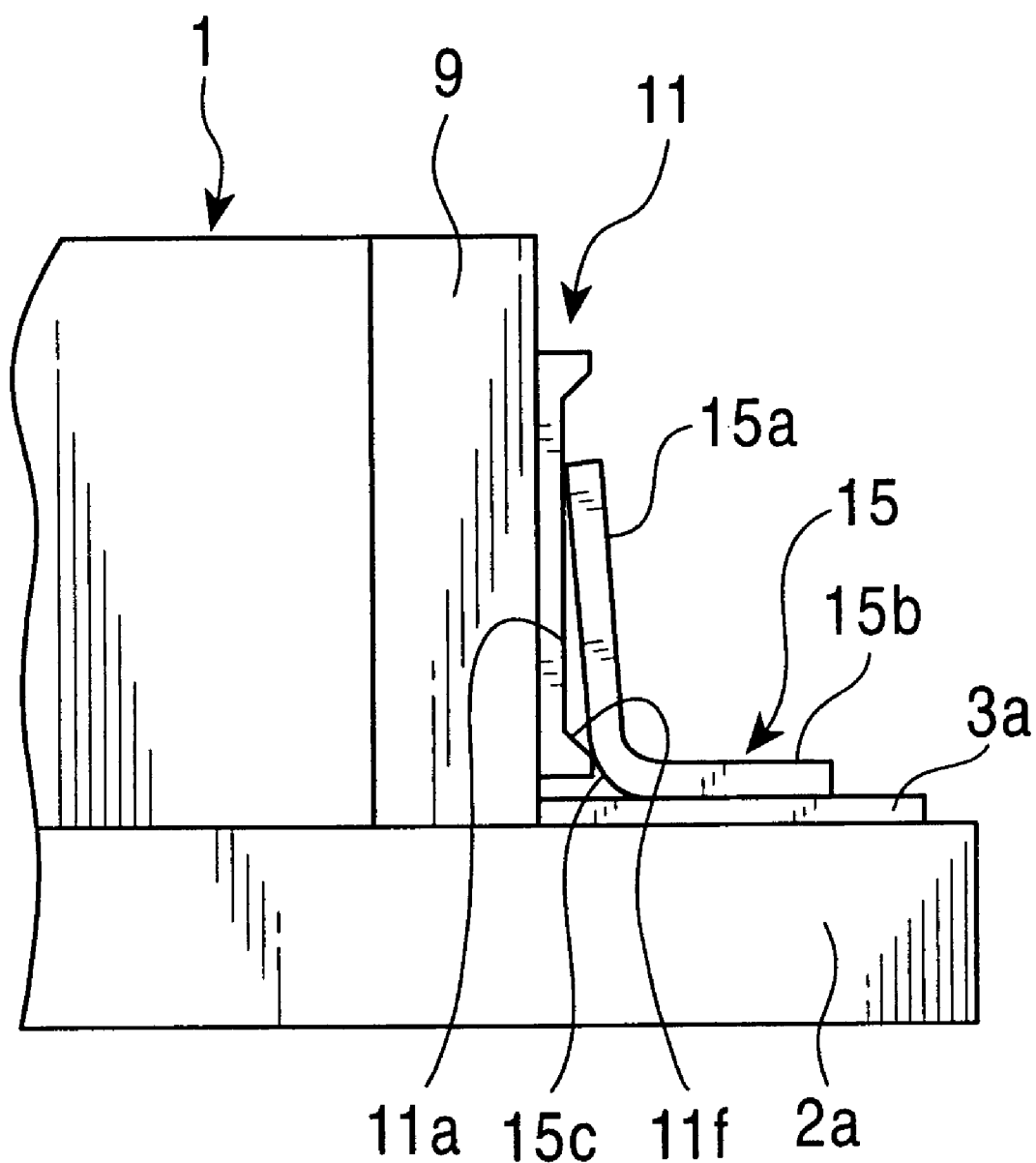
FIG. 17 is an example explanatory drawing showing a bonded state of a pad and a bonding member of the conventional magnetic head of another embodiment.

In a process for forming the pad shown in FIG. 8F, by plating using gold or the like, the contact area 10d of the bump 10 exposed from the protective layer 9 is covered, and the pad 11 in the form of a rectangle extended to the vicinity of the bottom surface of the slider 1 is formed. In this stage, the sufficiently large bonding area 11c of the pad 11 formed on the surface of the protective layer 9 is formed adjacent to the bottom surface 1b of the slider 1.

In the magnetic head described above, even though the following are not shown, a mount 5 is mounted to a driving arm of the magnetic hard disc device, a surface of the slider 1 is disposed so as to oppose the magnetic recording surface of the magnetic disc, and the slider 1 fixed to the flexure 2 is raised at a predetermined distance over the magnetic recording surface of the magnetic disc during an operation of the magnetic hard disc. The head element 7 is connected to the outside through the lead wires 8, the bumps 10, and the conductive pattern 3 bonded by the bonding member to the bump 10 via the pad 11 so as to perform magnetic writing on and reading from the magnetic disc.

What is claimed is:

1. A magnetic head comprising:
 a slider comprising:
  a head element for performing at least one of writing on and reading from a magnetic recording medium; and
  a bump comprising metal and having an electrical contact area, the bump being electrically connected to the head element, the head element and the bump being formed at a side wall of the slider,
 a protective layer comprising an insulating material,
 a pad comprising a metal film,
 a bonding member, and
 a conductive pattern for electrically connected to an external circuit,
 wherein the protective layer covers over the side wall of the slider except for the electrical contact area of the bump, the pad covers the surface of the protective layer and the surface of the contact area of the bump, and is bonded to the conductive pattern with the bonding member therebetween, and the bonding member is bonded in a bonding area of the pad formed on a surface of the protective layer.

2. A magnetic head according to claim 1, wherein an end portion of the conductive pattern and the side wall of the slider are disposed so as to oppose each other on a flexure, and the bonding member is approximately spherical, and contacts the bonding area approximately at the center thereof of the pad and the end portion of the conductive pattern.

3. A magnetic head according to claim 2, wherein the bonding area is a part of the pad, being at least a half of the height of the pad from the conductive pattern and being adjacent thereto.

4. A magnetic head according to claim 1, wherein an end portion of the conductive pattern and the side wall of the slider are disposed so as to oppose each other on a flexure, and the bonding member is a wire, and a front edge portion of the wire contacts the bonding area of the pad and the other edge portion of the wire contacts the conductive pattern.

* * * * *